United States Patent [19]
Graef

[11] Patent Number: 5,974,248
[45] Date of Patent: Oct. 26, 1999

[54] INTERMEDIATE TEST FILE CONVERSION AND COMPARISON

[75] Inventor: Stefan Graef, Milpitas, Calif.

[73] Assignee: LSI Logic Corporation, Milpitas, Calif.

[21] Appl. No.: 08/772,400

[22] Filed: Dec. 23, 1996

[51] Int. Cl.[6] .................................................. G06F 9/455
[52] U.S. Cl. ............... 395/500.43; 714/741; 395/500.05
[58] Field of Search .................................. 364/578, 488, 364/489, 490, 491; 714/741

[56] References Cited

U.S. PATENT DOCUMENTS

| | | | |
|---|---|---|---|
| 5,111,413 | 5/1992 | Lazansky et al. | 364/578 |
| 5,384,710 | 1/1995 | Lam et al. | 364/489 |
| 5,446,742 | 8/1995 | Vahabi et al. | 371/27 |
| 5,452,227 | 9/1995 | Kelsey et al. | 364/489 |
| 5,644,581 | 7/1997 | Wu | 371/27 |

OTHER PUBLICATIONS

Eurich et al., "EDIF Grows Up", IEEE Spectrum, Nov. 1990, pp. 68–72.
Chowanetz et al., "Aspects on Integration of High–Speed Multiplexers and Demultiplexers in VLSI–Test systems", 1991 IEEE VLSI Test Symposium, Paper 7.3, pp. 128–133.

Harrold et al., "A High–Level Test Program Language for Analog and Mixed–Signal Test Program Development", IEEE European Test Conference, 1993 Proceedings, pp. 519–520.

*Primary Examiner*—Vincent N. Trans
*Assistant Examiner*—Russell W. Frejd

[57] ABSTRACT

A method for comparing intermediate test files having different file formats used to test integrated circuitry is provided. The method initially receives intermediate test files from an ATPG tool or a manually run simulation. The ATPG tool or manually run simulation provides data in a .wgl format for testing, and is a non-simulatable format, and the ATPG tool also provides a second intermediate file comprising a file or files in a simulatable format. All files contain event data used for testing. The intermediate test files are converted to files having a common format. The invention then compares the converted files to determine mismatches between the converted files. This comparison comprises evaluating the common format files and generating a pass/fail flag based on the results of the evaluation. Mismatches between the common format are corrected if the flag indicates that the files are not identical. The system transforms any converted files which were altered by the previous steps back to the previous format.

20 Claims, 2 Drawing Sheets

INTERMEDIATE TEST FILE CONVERSION AND COMPARISON

BACKGROUND OF THE INVENTION

1. Field of the Invention

This invention relates generally to the design of electronic circuits and more particularly to authentication of data files used in simulation and verification of testing procedures.

2. Description of the Related Art

The automated process of designing integrated circuits comprises establishing a netlist and subsequently preparing a layout of the design using layout tools. Once the layout is complete, the layout is simulated and tested to verify the overall performance of the system.

The netlist along with other data, such as testbench and SDF (standard delay format) data, are provided to a simulator, such as a Verilog-XL simulator, for test condition simulation. A worst case commercial condition may also be simulated, i.e. the system may be simulated to have worst case delays or other errors in the system. The results of both simulations compared for mismatches or irregularities. After comparison, the simulation output results from both test condition simulation and worst case commercial condition simulation are submitted to testing, which occurs on a designed chip. Testing includes vector rule checking, WGL file generation, buffer and pin information, and other common procedures.

To assist in performing this physical chip testing procedure, the system uses an Automatic Test Pattern Generation (ATPG) tool. The ATPG tool generates test patterns which permit testing of digital circuitry by toggling all the nodes of the proposed circuit to trace "stuck at" faults, thereby verifying the performance of individual gates. "Stuck at" faults are a result of wires carrying a single signal, either 1 or 0 irrespective of the desired signal due to a short in the system. The ATPG tool can write normal Verilog or VHDL testbench which can simulate the device with a generated pattern and verify that all requirements have been met.

An ATPG tool may generate several types of intermediate files for use during testing. For example, the ATPG tool may generate what are commonly known as .wgl files, .v files, .vhd files, .scl files, or .scf files. A .wgl file includes stimulation data and expected result data, as well as timing information, clock period, and other data for every pin on the device. The .wgl file is an intermediate format, industry standard format which contains intermediate test data. A .v file is a testbench file which has simulation data and expected result data, clock timing data, etc., but is simulatable, and may be used on particular testing tools, such as a Synopsis VSS tool or a Verilog XL or similar simulation tool to verify performance of the system, which cannot be accomplished on an ATPG tool. A .vhd file is a VHDL file format containing test data, an .scl file is a simulation control language file, and a .saf file is a safe file format, which are other intermediate file formats used for specific types of simulators. .saf and .scl files are used for CMDE (Concurrent Modular Design Environment) simulation, and .v and .vhd files are used for VHDL simulation. All these intermediate files contain test data for simulating the circuit. The .v, .vhd, .scl, and .saf files are simulatable, whereas the .wgl file data is not simulatable.

After creating the .wgl file, the specific data from the .wgl file is modified using an additional test program specific test generator, which generates tester specific test program, which is downloaded to the tester, and the tester understands the language and performs the test on the physical silicon device.

The problem associated with these intermediate files is that different tools used by different manufacturers may produce different stimuli data results, or may write out wrong or inconsistent expected results in .wgl or .v files. It is critical that the intermediate files have the same results, so that test and simulation results match identically to give the tester the ability to perform accurate test procedures. Under particular conditions, the ATPG tool may write our different vectors or timing to the v file and the .wgl file.

The problem is that during the test phase a mismatch may be realized by either software or by human visual evaluation, such as by failures of chip performance traced back to improper test results. The difficulty is that the error or mismatch between test and simulation data cannot be easily traced to particular origins; the most that can be said of a mismatch is that a discrepancy between data in intermediate test files has occurred, but the cause of the mismatch cannot readily be pinpointed. The true cause of the test pattern simulation problem cannot be identified.

Currently, the only way for locating the problem associated with an intermediate file mismatch is to create the two intermediate files, pass the intermediate files to the appropriate testing devices, perform the required tests on actual physical silicon, and once a mismatch is detected to report the mismatch or improper test results back to the party or entity who created the tools, such as the ATPG tool, which generate intermediate files with instructions to repair the problem. This method requires testing on actual silicon, and may not be detected for several testing runs, thereby losing time associated with runs occurring before detecting the mismatch and requiring such test runs to be performed more than once. This after-the-fact correction procedure may waste several days or even weeks, and such a holdup during physical testing can be costly and time consuming. In extreme cases, prototypes may have to be put on hold for extended periods of time due to faulty test results.

It is therefore an object of the current invention to provide a system or method for evaluating and improving the quality of intermediate files generated by test pattern generation tools and/or simulations by minimizing the risk of a mismatch between such intermediate files.

It is another object of the current invention to provide a system or method for minimizing disruptions during testing of fully designed and integrated silicon.

It is yet another object of the current invention to provide a system or method of testing physical silicon integrated circuitry using existing file formats, file generation tools, and simulators while at the same time decreasing the chances of encountering improper test results due to multiple file formats.

SUMMARY OF THE INVENTION

According to the current invention, there is provided a system or method for comparing a plurality of intermediate test files used to test integrated circuitry. The intermediate test files have different file formats. The invention comprises initially receiving intermediate test files from an ATPG tool or a manually run simulation. The ATPG tool or manually run simulation provides data in a .wgl format for testing, and is a non-simulatable format, and the ATPG tool also provides a second intermediate file comprising files in a simulatable format having the designation v, .vhd, .scl, or .scf. These files may have other designations and/or formats, but all files contain event data used for either testing or simulation.

The invention further comprises converting said intermediate test files to files having a common format, which may comprise converting .wgl files to a simulation readable format, or vice versa, or converting all files to a common format. The invention then compares the converted files to determine mismatches between the converted files. This comparison comprises evaluating the files having a common format and generating a pass/fail flag based on the results of the evaluation.

The invention then corrects mismatches between the common format if the flag indicates that the files are not identical. Determining the proper event data may require resorting to the original design specifications and manually evaluating the desired performance, or may include coding the system to correct one file in a predetermined matter, such as always correcting the .wgl file in case of a mismatch.

Finally, the system transforms any converted files which were altered by the previous steps back to the previous format. The .wgl, V, .vhd, .scl, .saf, or other data files pass to the simulator and to the test program specific test generator. The testing personnel may at this point evaluate the cause of the mismatch in the ATPG tool and/or manually run simulation and correct the error.

Other objects, features, and advantages of the present invention will become more apparent from a consideration of the following detailed description and from the accompanying drawings.

DETAILED DESCRIPTION OF THE INVENTION

Figure 1:
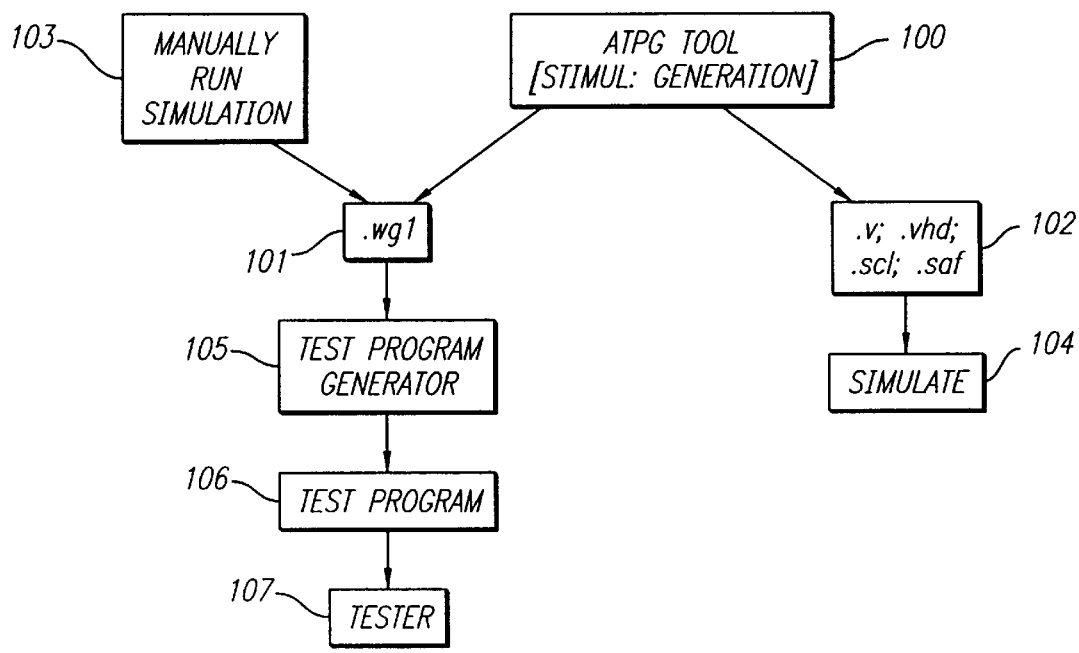
FIG. 1 illustrates the prior art system of generating test programs for devices used to test silicon chips and for simulating testing.

FIG. 1 is a block diagram illustrating the typical prior test program generation procedure using an ATPG tool. As shown in FIG. 1, the ATPG tool 100 generates various test programs which are predetermined to properly stimulate all of the logic contained in an integrated circuit. Many different types of ATPG tools are commonly available, such as the Mentor Fast Scan tool or the Synopsis Test Compiler tool. The ATPG tool 100 generates two types of files, a .wgl file 101, and a second intermediate file 102. The second intermediate file consists of files having the designation .v, .vhd, .scl, or .scf, but may have other designations and/or formats and still be within the scope of the current invention.

The .wgl file 101 contains intermediate test data, including stimulation data and expected result data, as well as timing information, clock period, and other data for every pin on the device, and is an industry standard file type which is commonly used for silicon simulation and verification. The .wgl test file is used to generate the test program used to test the actual silicon device.

The second intermediate test file 102 may be a .v file, which is a testbench file having simulation data and expected result data, clock timing data, etc., but is simulatable, and may be used in connection with particular testing tools, such as a Synopsys VSS tool or a Verilog XL or similar simulation tools to verify performance of the system, which cannot be accomplished using the ATPG tool 100. A .vhd file is a VHDL file format containing test data, an .scl file is a simulation control language file, and a .saf file is a safe file format, which are other intermediate file formats used for specific types of simulators. .saf and .scl files are used for CMDE simulation, and .v and .vhd files are used for VHDL simulation.

All these intermediate files contain test data for stimulating the circuit. The difference between the .wgl file 101 and the second intermediate file 102 is that the .v, .vhd, .scl, and .saf files are simulatable, i.e. can be put on known a simulation device 104, such as the Synopsis VSS or Verilog XL, to evaluate whether the simulation results satisfy the design requirements without performing the test on silicon devices. The .wgl file data is not simulatable, i.e. is not in a format which can be used by known simulation devices 104. While the ATPG tool 100 writes the same data, it writes the data in different formats due to the subsequent devices using the data and the formatting requirements of those tools.

As an alternative to the ATPG tool 100 generating the .wgl file 101, the stimulation data may be generated using a manually run simulation 103. This manually run simulation 103 generates test data for functional verification at the earliest design stage. This can be translated into .wgl file 101 separate and apart from the ATPG tool 100, which would still generate the second intermediate file 102.

All file formats include event data, but are generated format-dependent based on the tools, software, or devices which will ultimately use them. The event data relates to particular physical inputs, or input pins, on the device, and particular physical outputs, or output pins, on the device. Each device typically has several input and output pins, and event data consists of a clock sequence wherein a particular input is toggled at a particular time, and the resulting effect on output at a particular number of clock cycles afterward. Toggling of primary inputs results in events occurring on particular primary outputs at a time subsequent. Thus, the event file includes the relevant times, or clock cycles, the stimulated input, the level of stimulation (high/low, particular voltage application or variation, etc.) and the resultant effect on primary outputs at subsequent times. As may be appreciated, for integrated circuits having thousands or even millions of gates located thereon, the resulting event file may be extremely large, i.e. into the hundreds of megabytes. A single mismatch due to formatting problems will result in results during physical testing which differ from results obtained from simulation.

Once the .wgl file 101 has been created, the specific data from the .wgl file is modified using an additional test program specific test generator 105, which generates a tester specific test program 106. This tester specific test program 106 is downloaded to the tester 107 in a tester compatible format. The tester 107 performs the required test on the physical silicon device.

The problem associated with these intermediate files is that different tools used by different manufacturers may produce different stimuli data results, or may write out wrong or inconsistent expected results in .wgl or .v files. It is critical that the intermediate files have the same contents, so that test and simulation results match identically to give the tester the ability to perform accurate test procedures.

Figure 2:
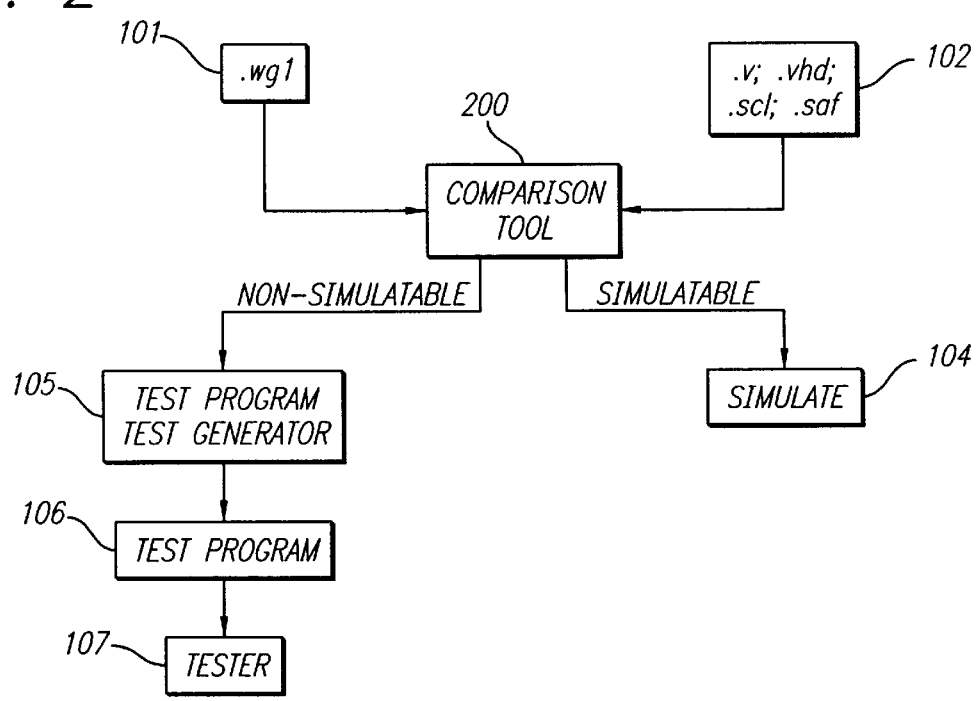
FIG. 2 shows the design of the current invention including the comparison tool.

FIG. 2 illustrates a comparison tool 200 used in connection with the arrangement shown in FIG. 1. The comparison tool 200 evaluates the .wgl file 101 and the second intermediate file 102 to determine whether a mismatch exists between the contents of the two files. The comparison tool 200 extracts the event data from both formats, compares the event data, and once the comparison is complete generates a pass or fail flag. On receiving a pass flag, all other components disclosed in FIG. 1 continue to operate in the manner as shown therein. A fail flag indicates at least one mismatch exists, and the mismatch is reported, and processing stops prior to passing the second intermediate file 102 to the simulator 104 and before passing the .wgl file 101 to test program specific test generator 105. The designer or testing personnel may then evaluate the mismatch or mismatches and determine the proper event data, and correct either the .wgl, .v, .vhd, .scl, .saf, or other data files accordingly. Determining the proper event data may require resorting to the original design specifications and manually evaluating the desired performance. Once corrected, the corrected .wgl, .v, .vhd, .scl, .saf, or other data files pass to simulator 104 and test program specific test generator 105. The testing personnel may at this point evaluate the cause of the mismatch in the ATPG tool 100 and/or manually run simulation 103 and correct the ATPG tool 100 accordingly.

Figure 3:
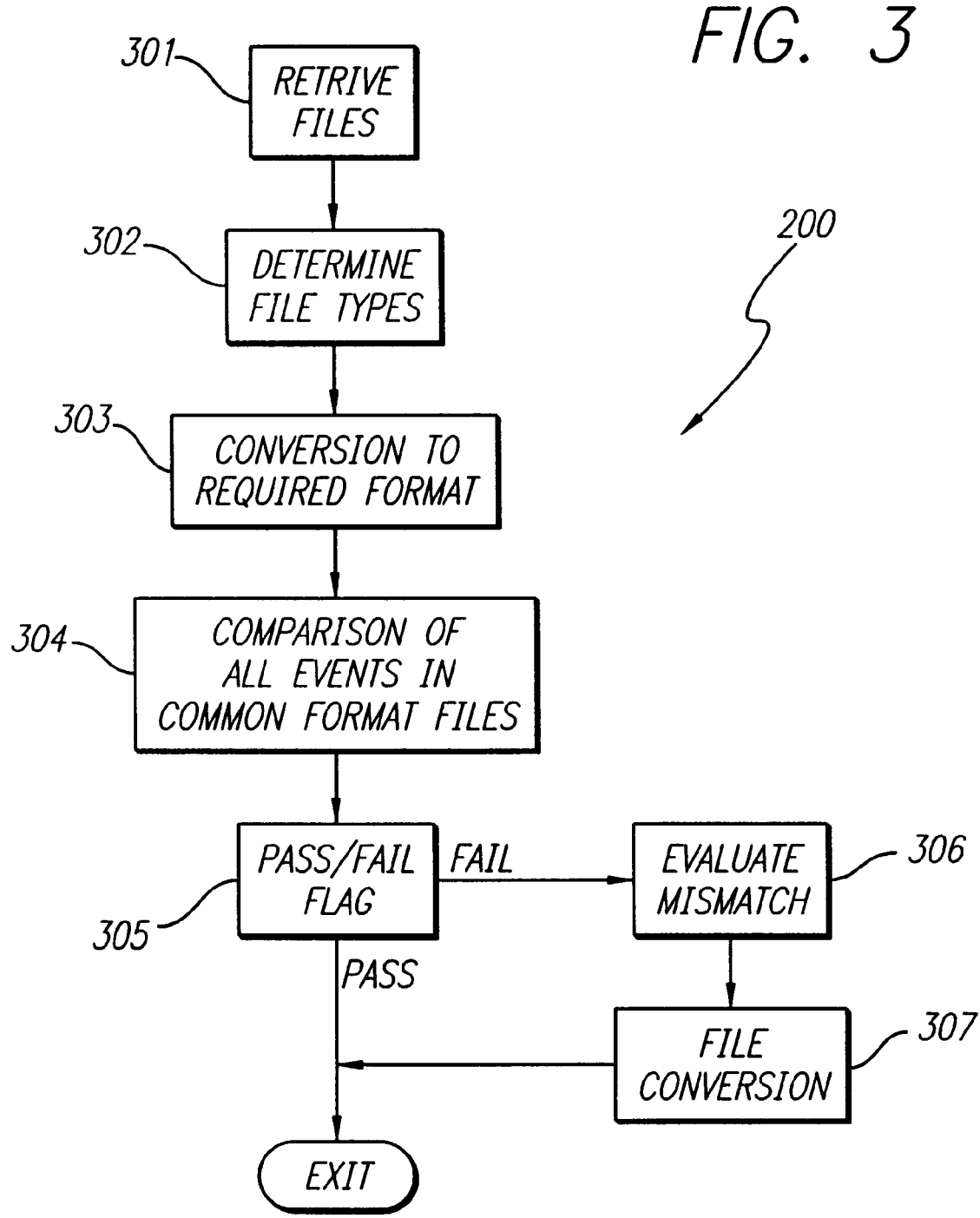
FIG. 3 is the flow diagram of the operation of the comparison tool in accordance with the current invention.

The design of the comparison tool 200 is illustrated in FIG. 3. From FIG. 3, the system first retrieves the .wgl file 101 and the second intermediate file 102 in retrieving step 301. The type of second intermediate file, or files, is determined in step 302. The conversion step 303 may perform a conversion from .wgl format to the required simulatable format (i.e., to .v, .vhd, .scl, .saf, or other appropriate file format), or may convert event and timing data from this simulatable format (.v, .vhd, .scl, .saf, or other format) into the .wgl file format, or may perform the reverse of the ATPG tool 100 conversion by reversing the ATPG tool 100 conversion by converting both the .wgl file 101 and the second intermediate file 102 from their respective formats into stimuli generation data. As may be appreciated, conversion of both formats back to stimuli data may take appreciably longer than converting a single file into a different format.

Once the conversion step 303 has occurred, the system performs the comparison step 304 whereby all events are compared, including application of particular stimuli, time of application, location of stimuli application, time of change due to application stimulation, pin affected by location stimulation, and quantity of effect on pin as a result of stimulation application. The comparison of the two files may use, for example, the UNIX "diff" command, which evaluates two files and produces the differences between the two files. On completion of the comparison step 304, flag step 305 issues a pass or fail flag indicating whether a mismatch occurred. If a pass flag is generated, the comparison tool 200 has completed its task.

If a mismatch occurs, then evaluation step 306 evaluates the mismatch. Evaluation step 306 may entail changing all mismatches to agree with a preferred file format, i.e. all mismatches between a .wgl file and a converted .v file would entail changing the converted .v file value to be the same as that of the .wgl file. This is an automatic hard-wired result driven mechanization which may result in inaccurate test results. Alternately, and the preferred implementation of the evaluation step 306, would be for the fail flag to be passed to test personnel and testing halted. The evaluation step 306 would pass the areas of mismatch to the test personnel who would review the design and determine the correct value at the mismatched location, and alter either file (or possibly both files) accordingly. This preferred method will take considerably more time than the aforementioned automatic hard-wired result driven mechanization, but if speed is desired over accuracy then the result-driven method may be preferable. Alternately, the design may be prioritized, i.e. certain paths or stimuli may be indicated as critical while others may be indicated as non-critical. On encountering a mismatch, if the stimuli is considered non-critical, the result may be set in a similar manner to the result-driven method, i.e., one predetermined file is set to the value of the other file and the testing procedure continues. If, however, the stimuli has been designated critical, the testing procedure is halted, the fail flag and the location of the mismatch passed to the test personnel, and determination of the cause of the mismatch proceeds.

Once the mismatch has been isolated and the correct value decided, the switch of data is made and both files are converted to the proper format, if required, in file conversion step 307. If only one file has been changed to another format, the changed file is converted back to the original format. For this step, the designer/test personnel must take care that the conversion process does not repeat the mistake of the original ATPG tool conversion, and it is preferred that the converted file be compared with the previous incorrect file. For example, if the designer converted .v data to .wgl format, and the error was in the converted .v file and was subsequently changed in step 306, the converted .v file is converted back to .v format, and the converted back .v file may be compared to the original .v file generated by the ATPG tool. Note that if in this example the .v file was determined correct in step 306 but that the .wgl file was wrong, the .wgl file could be corrected in step 306 and the conversion back of the .v file would be unnecessary. The .v file as received from the ATPG tool 100 was correct and could be used in the simulator 104 without the need to convert the converted .v file from .wgl format back to .v format.

If both formats are converted to a single neutral format or back to the original stimuli data, on determining the mismatch or mismatches, at least one and possibly both of the files must be converted back to their original format, with care that the ATPG tool 100 or manually run simulation 103 mistake is not repeated. It is optional at this point that the ATPG tool and any other tool used to generate the intermediate .wgl, .v, .vhd, .scl, .saf, or other files be evaluated and the problem in file generation corrected.

Once the mismatch has been repaired in evaluation step 306 and appropriate data converted in step 307, the comparison tool 200 has then completed its task and testing/simulation may proceed according to FIG. 2. At this point, testing of the silicon and simulation may take place with known uniform data.

While the invention has been described primarily with respect to conversion and checking of two files, it is to be understood that the invention is not so limited, and the invention may be used in conjunction with multiple files having different formats as long as all files can be converted to a common format and evaluated for mismatches. It is within the scope of the present invention to also provide, for example, multiple conversion steps, evaluation steps, and conversions back to previous formats.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

I claim:

1. A method for comparing a plurality of intermediate test files used to test integrated circuitry, said intermediate test files having different file formats, comprising the steps of:

receiving said intermediate test files;

converting said intermediate test files to converted files having a common format; and comparing the converted file contents to determine mismatches between said converted files.

2. The method of claim 1, wherein said intermediate test files comprise a simulation readable format file and a non-simulation readable format file.

3. The method of claim 2, wherein said non-simulation readable file comprises a file in .wg1 format.

4. The method of claim 2, wherein said converting step comprises converting one file to the format of another file.

5. The method of claim 1, wherein said comparing step comprises evaluating the test files in a common format and generating a flag based on the results of said evaluation.

6. The method of claim 5, further comprising correcting said mismatches if said flag indicates said test files are not identical.

7. The method of claim 6, further comprising the step of converting said files from the common format back to intermediate file format using a predetermined procedure.

8. A method for verifying files used to test integrated circuitry, comprising the steps of:

generating a plurality of intermediate test files, each test file comprising event data, wherein a plurality of said intermediate test files have different file formats; and performing a comparison of said plurality of intermediate data files; and correcting said intermediate test files if said comparing step indicates said intermediate data files are not identical.

9. The method of claim 8, wherein said comparison performing step comprises evaluating said intermediate data files for mismatches therebetween.

10. The method of claim 9, wherein said evaluating of intermediate data files comprises:

converting at least one of said intermediate data files wherein the resulting files have a common format; and comparing said common format files to determine any mismatches in data.

11. The method of claim 10, further comprising correcting said mismatches if said comparing step indicates said common format files are not identical.

12. The method of claim 8, wherein said intermediate test files comprise a simulation readable format file and a non-simulation readable format file.

13. The method of claim 11, further comprising the steps of:

transforming converted files back to their intermediate file format; and comparing said converted intermediate files with respective intermediate data files.

14. A method of generating a plurality of comparable event data files used in testing integrated circuitry, at least one data file having a different format than other data files, comprising the steps of:

creating a plurality of intermediate data files having different file formats;

comparing the contents of said intermediate data files; and altering at least one of said intermediate data files into comparable event data files if said comparing step indicates that the intermediate data files are not comparable.

15. The method of claim 14, further comprising the step of converting intermediate data files to a common file format before executing said comparing step.

16. The method of claim 15, further comprising the step of transforming files modified by said converting step and changed by said altering step back to their previous format.

17. The method of claim 14, wherein said comparing step comprises evaluating said intermediate data files for mismatches therebetween.

18. The method of claim 14, wherein said comparing step comprises converting one file to the format of another file.

19. The method of claim 14, wherein said intermediate test files comprise a simulation readable format file and a non-simulation readable format file.

20. The method of claim 19, wherein said non-simulation readable file comprises a file in .wg1 format.

* * * * *